(12) United States Patent
Konishi

(10) Patent No.: US 10,170,383 B2
(45) Date of Patent: Jan. 1, 2019

(54) SEMICONDUCTOR DEVICE

(71) Applicant: Mitsubishi Electric Corporation, Tokyo (JP)

(72) Inventor: Yasuo Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/462,316

(22) Filed: Mar. 17, 2017

(65) Prior Publication Data
US 2018/0076104 A1    Mar. 15, 2018

(30) Foreign Application Priority Data

Sep. 13, 2016   (JP) ................. 2016-178595

(51) Int. Cl.
| | |
|---|---|
| *H01L 23/10* | (2006.01) |
| *H01L 23/057* | (2006.01) |
| *H01L 23/373* | (2006.01) |
| *H01L 23/00* | (2006.01) |
| *H01L 23/24* | (2006.01) |
| *H01L 23/053* | (2006.01) |

(52) U.S. Cl.
CPC ............ *H01L 23/10* (2013.01); *H01L 23/057* (2013.01); *H01L 23/24* (2013.01); *H01L 23/3735* (2013.01); *H01L 24/48* (2013.01); *H01L 23/053* (2013.01); *H01L 2224/48225* (2013.01); *H01L 2224/73265* (2013.01); *H01L 2924/00014* (2013.01); *H01L 2924/1033* (2013.01); *H01L 2924/10254* (2013.01); *H01L 2924/10272* (2013.01); *H01L 2924/19107* (2013.01)

(58) Field of Classification Search
CPC ... H01L 33/483; H01L 33/486; H01L 33/502; H01L 33/505; H01L 33/56; H01L 33/62
See application file for complete search history.

(56) References Cited

U.S. PATENT DOCUMENTS

| | | | |
|---|---|---|---|
| 2013/0240909 A1* | 9/2013 | Hiramatsu | ............. H01L 23/24 257/77 |
| 2016/0148853 A1* | 5/2016 | Katsuki | ................. H01L 23/057 257/693 |

FOREIGN PATENT DOCUMENTS

JP        2000-323593 A    11/2000

* cited by examiner

*Primary Examiner* — Cuong Q Nguyen
(74) *Attorney, Agent, or Firm* — Studebaker & Brackett PC

(57) ABSTRACT

A semiconductor device includes: an insulating board; a circuit pattern disposed on the insulating board; a semiconductor chip connected to the circuit pattern; a case disposed on the insulating board to surround the circuit pattern and the semiconductor chip and not bonded to the insulating board; and a cured resin disposed in the case to seal the circuit pattern and the semiconductor chip.

14 Claims, 4 Drawing Sheets

SEMICONDUCTOR DEVICE

BACKGROUND OF THE INVENTION

Field

The present invention relates to a semiconductor device wherein the interior of a case is sealed with a resin.

Background

Semiconductor devices are used in all scenes including electric power generation, electric power transmission, and effective energy use and renewal. In the semiconductor device, semiconductor chips are connected to a circuit pattern on an insulating board, a case is disposed on the insulating board to surround the semiconductor chips, and an interior of the case is sealed with a resin (for example, see Japanese laid-open patent publication No. 2000-323593). Since the resin is injected into the case in liquid form, the resin must be prevented from being leaked from a gap between the insulating board and the case before the resin is cured.

In the past, an insulating board and a case are bonded to each other with an adhesive material to seal a gap between a case resin and the insulating board so as to prevent liquid from being leaked. Thus, before the resin is injected, the adhesive material must be annularly coated on the entire circumference of the outer periphery of the insulating board and cured. Therefore, times for the coating step and the curing step for the adhesive material are necessary, and the manufacturing time becomes disadvantageously long.

SUMMARY

The present invention has been made to solve the problem described above, and has its object to obtain a semiconductor device the manufacturing time of which can be shortened by omitting a coating step and a curing step for an adhesive material.

According to the present invention, a semiconductor device includes: an insulating board; a circuit pattern disposed on the insulating board; a semiconductor chip connected to the circuit pattern; a case disposed on the insulating board to surround the circuit pattern and the semiconductor chip and not bonded to the insulating board; and a cured resin disposed in the case to seal the circuit pattern and the semiconductor chip.

In the present invention, the case is not bonded to the insulating board, and the entire device is fixed with the cured resin. Therefore, the manufacturing time can be shortened by omitting the coating step and the curing step for the adhesive material.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
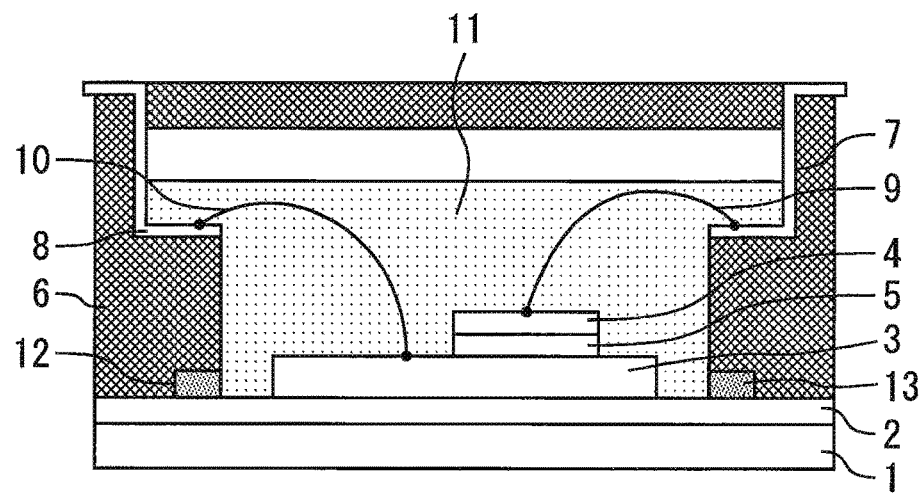
FIG. 1 is a sectional view showing a semiconductor device according to Embodiment 1 of the present invention.
Figure 2:
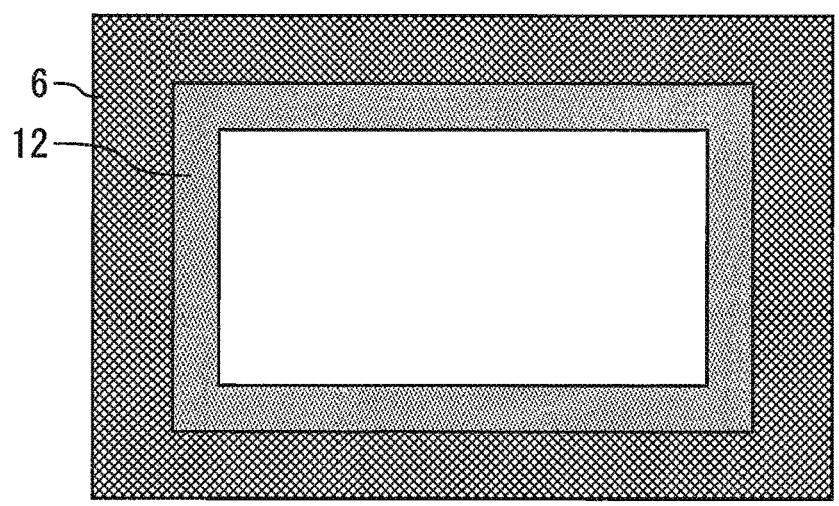
FIG. 2 is a lower view showing a case of the semiconductor device according to Embodiment 1 of the present invention.

FIG. 1 is a sectional view showing a semiconductor device according to Embodiment 1 of the present invention. FIG. 2 is a lower view showing a case of the semiconductor device according to Embodiment 1 of the present invention. An insulating board 2 is disposed on a heat sink 1, and a circuit pattern 3 is disposed on the insulating board 2. The heat sink 1, the insulating board 2, and the circuit pattern 3 are integrated with each other.

A semiconductor chip 4 such as a current switching device is connected to the circuit pattern 3 with a solder 5. A case 6 is disposed on the insulating board 2 to surround the circuit pattern 3 and the semiconductor chip 4. Note that the case 6 is not bonded to the insulating board 2 and is not fixed thereto with a screw or the like. Electrodes 7 and 8 are arranged or built in the case 6. An upper-surface electrode of the semiconductor chip 4 is connected to the electrode 7 with a wire 9, and the circuit pattern 3 is connected to the electrode 8 with a wire 10.

An epoxy resin 11 is disposed in the case 6 to seal the circuit pattern 3, the semiconductor chip 4, and the like. An uncured source material 12 is annularly disposed in a gap between the upper surface of the insulating board 2 and the lower surface of the case 6 and directly contacts with the upper surface of the insulating board 2 and the lower surface of the case 6. The source material 12 is a material such as a polyester thermoplastic elastomer which is not cured not only in course of manufacture but also after manufacturing and has a viscosity higher than that of the uncured resin 11.

In the embodiment, the case 6 is not bonded to the insulating board 2, and the entire device is fixed with the cured resin 11. Therefore, the manufacturing time can be shortened by omitting the coating step and the curing step for the adhesive material. In addition, in a period required until the resin 11 is cured, the source material 12 can prevent the uncured resin 11 from leaking from the gap between the insulating board 2 and the case 6.

Embodiment 2

Figure 3:
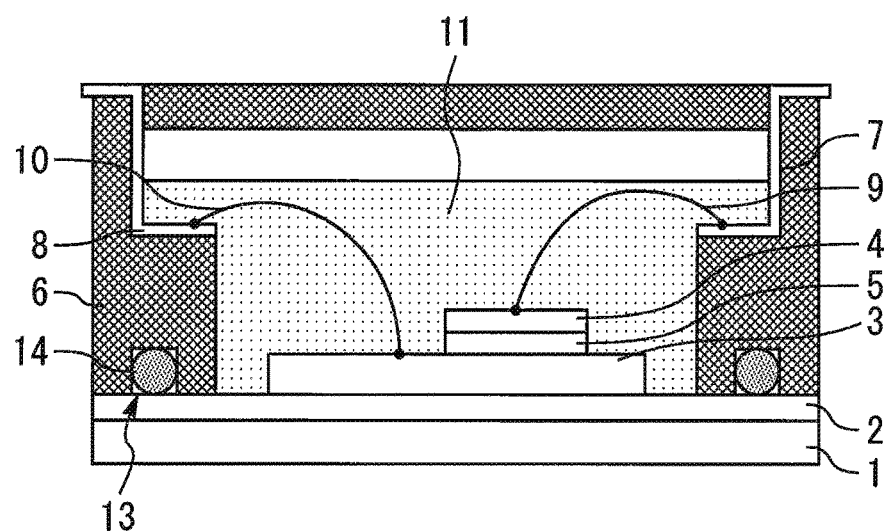
FIG. 3 is a sectional view showing a semiconductor device according to Embodiment 2 of the present invention.
Figure 4:
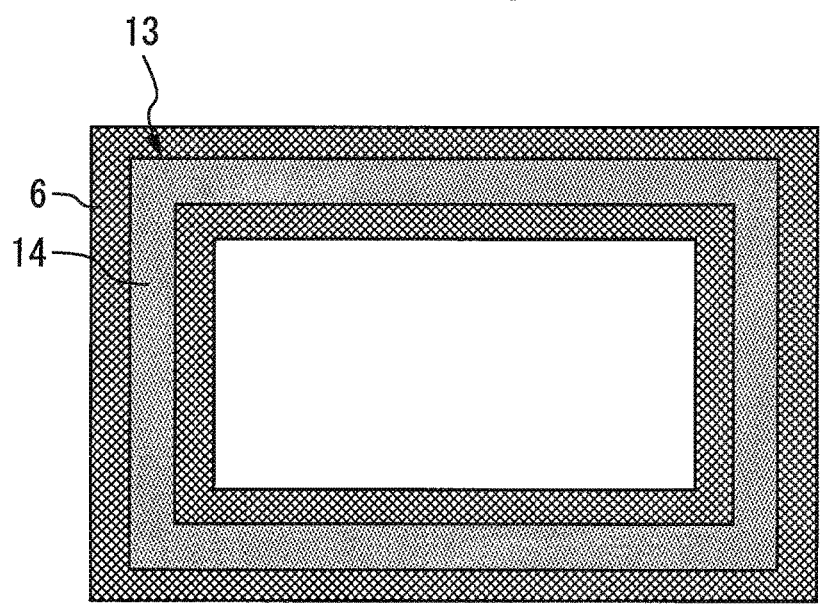
FIG. 4 is a lower view showing a case of the semiconductor device according to Embodiment 2 of the present invention.

FIG. 3 is a sectional view showing a semiconductor device according to Embodiment 2 of the present invention. FIG. 4 is a lower view showing a case of the semiconductor device according to Embodiment 2 of the present invention. In the embodiment, in place of the source material 12 according to Embodiment 1, a concave part 13 is annularly formed in the lower surface of the case 6. An elastic member 14 such as rubber is annularly disposed in the concave part 13 of the case 6 and directly contacts with the upper surface of the insulating board 2 and the lower surface of the case 6. The natural length of the elastic member 14 which is not compressed in the concave part 13 is greater than the depth of the concave part 13. The other configurations in Embodiment 2 are the same as those in Embodiment 1.

In a period until the resin 11 is cured, the weight of the semiconductor device or external stress presses the elastic member 14 against the insulating board 2. In this manner, since the gap between the insulating board 2 and the elastic member 14 can be eliminated to reliably secure the airtightness, the uncured resin 11 can be prevented from leaking. As in Embodiment 1, the case 6 is not bonded to the insulating board 2, and the entire device is fixed by the cured resin 11. Therefore, the manufacturing time can be shortened by omitting the coating step and the curing step for the adhesive material.

In a period until the resin 11 is cured, the heat sink 1 and the case 6 are preferably held by a jig or the like. In addition, for example, a convex part made of the same material as that of the circuit pattern 3 and having a height equal to that of the circuit pattern 3 is disposed on the insulating board 2 below the elastic member 14 and may serve as an assistance for pressing.

Embodiment 3

Figure 5:
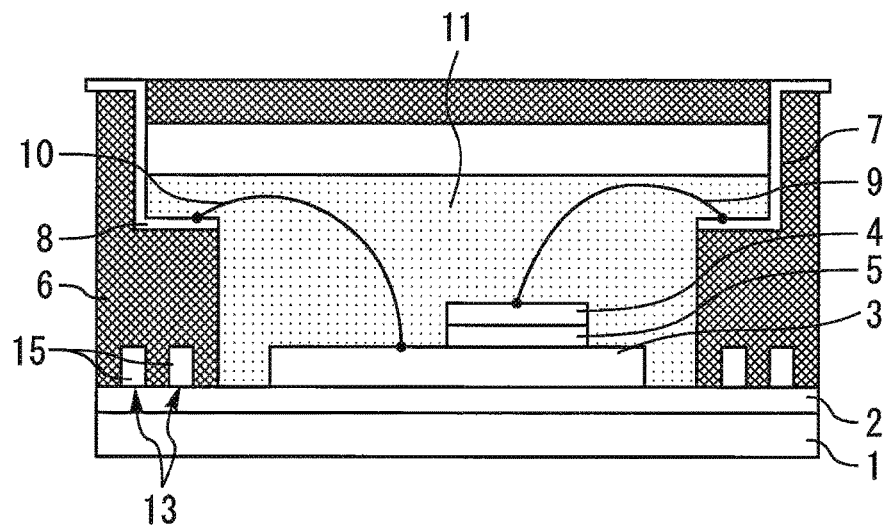
FIG. 5 is a sectional view showing a semiconductor device according to Embodiment 3 of the present invention.

FIG. 5 is a sectional view showing a semiconductor device according to Embodiment 3 of the present invention. In the embodiment, in place of the source material 12 according to Embodiment 1, a convex part 15 annularly disposed on the upper surface of the insulating board 2 is fitted in the concave part 13 annularly formed in the lower surface of the case 6. Each of the numbers of concave parts 13 and convex parts 15 may be plural or one. The other configurations of Embodiment 3 are the same as those of Embodiment 1.

In a period until the resin 11 is cured, the airtightness can be more reliably secured by the concave part 13 and the convex part 15 which are fitted. Therefore, the uncured resin 11 can be prevented from leaking. In addition, as in Embodiment 1, the case 6 is not bonded to the insulating board 2, and the entire device is fixed by the cured resin 11. Thus, the manufacturing time can be shortened by omitting the coating step and the curing step for the adhesive material.

The convex part 15 is made of the same material as that of the circuit pattern 3 and has a height equal to that of the circuit pattern 3. In this manner, the convex part 15 can be formed by the same process for forming the circuit pattern 3. Furthermore, the depth of the concave part 13 is equal to or greater than the height of the convex part 15. Therefore, bad fits caused by manufacturing tolerance can be eliminated.

Embodiment 4

Figure 6:
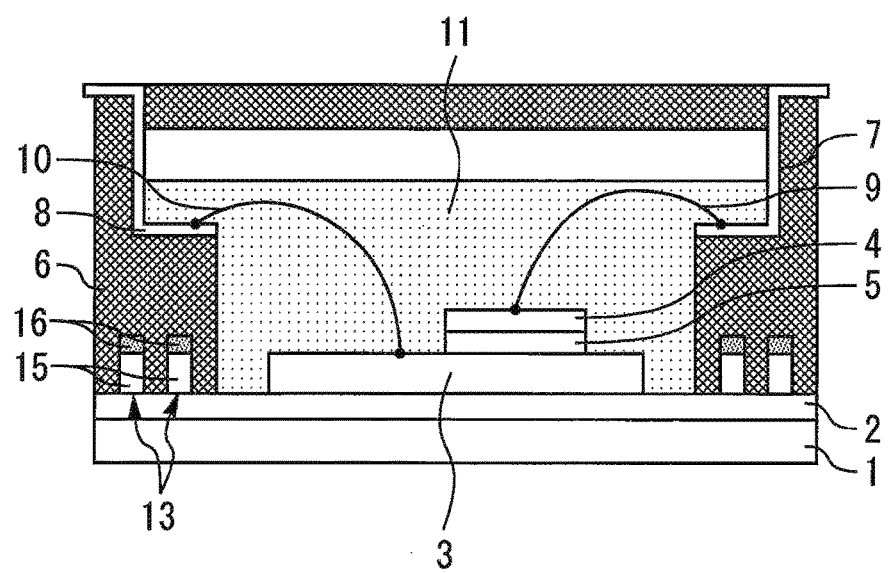
FIG. 6 is a sectional view showing a semiconductor device according to Embodiment 4 of the present invention.

FIG. 6 is a sectional view showing a semiconductor device according to Embodiment 4 of the present invention. In addition to the configuration of Embodiment 3, an elastic member 16 is disposed on the convex part 15 in the concave part 13. The elastic member 16 is, for example, a resin resist. The elastic member 16 is disposed to make it possible to enhance the leakage preventing effect of the resin 11 in comparison with Embodiment 3. Therefore, since the resin 11 can be decreased in viscosity, a range of concept for the components of the semiconductor device is widened. The other configurations and other advantages in Embodiment 4 are the same as those in Embodiment 3.

Embodiment 5

Figure 7:
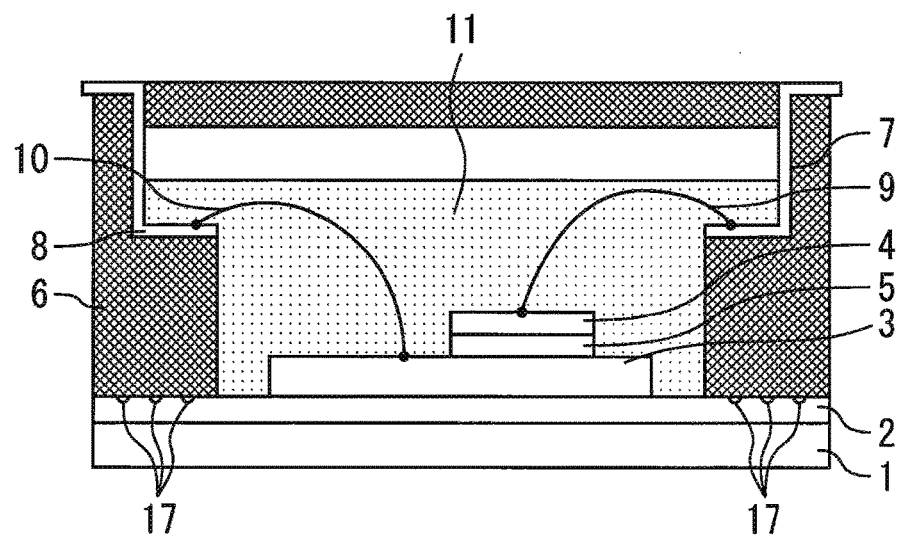
FIG. 7 is a sectional view showing a semiconductor device according to Embodiment 5 of the present invention.

FIG. 7 is a sectional view showing a semiconductor device according to Embodiment 5 of the present invention. In the embodiment, in place of the source material 12 according to Embodiment 1, a convex part 17 annularly formed on the lower surface of the case 6 cuts into the insulating board 2 made of a resin or the like having elasticity. The number of convex parts 17 may be plural or one. The convex part 17 has a triangular cross-section. The apexes of the convex part 17 may be rounded. The other configurations in Embodiment 5 are the same as those in Embodiment 1.

In a period until the resin 11 is cured, the airtightness can be reliably secured such that the convex part 17 cuts into the insulating board 2. Therefore, the uncured resin 11 can be prevented from leaking. As in Embodiment 1, the case 6 is not bonded to the insulating board 2, and the entire device is fixed by the cured resin 11. Therefore, the manufacturing time can be shortened by omitting the coating step and the curing step for the adhesive material.

Embodiment 6

Figure 8:
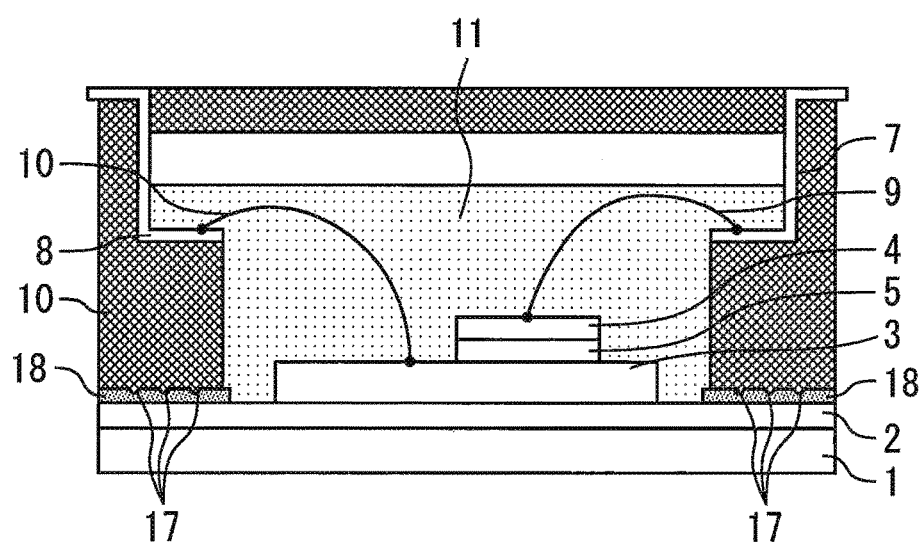
FIG. 8 is a sectional view showing a semiconductor device according to Embodiment 6 of the present invention.

FIG. 8 is a sectional view showing a semiconductor device according to Embodiment 6 of the present invention. In the embodiment, in place of the source material 12 according to Embodiment 1, an elastic member 18 made of, for example, resin resist ink or the like is annularly formed in a gap between the upper surface of the insulating board 2 and the lower surface of the case 6. The convex part 17 formed on the lower surface of the case 6 cuts into the elastic member 18. The number of convex parts 17 may be plural or one. Note that the convex part 17 has a triangular cross-section. The apexes of the convex part 17 may be rounded. The other configurations in Embodiment 6 are the same as those in Embodiment 1.

In a period until the resin 11 is cured, the elastic member 18 can prevent the uncured resin 11 from leaking from the gap between the insulating board 2 and the case 6. The convex part 17 cuts into the insulating board 2 to make it possible to more enhance a leakage preventing effect, and the range of choices for viscosity of the resin 11 can be expanded. Use of the elastic member 18 having a thickness and elasticity which can prevent liquid from leaking and can be maintained makes the convex part 17 unnecessary.

As in Embodiment 1, the case 6 is not bonded to the insulating board 2, and the entire device is fixed by the cured resin 11. Therefore, the manufacturing time can be shortened by omitting the coating step and the curing step for the adhesive material.

In Embodiments 1 to 6, the semiconductor chip 4 is not limited to a semiconductor chip made of silicon, and may be a semiconductor chip made of a wide-band-gap semiconductor having a band gap larger than that of silicon. The wide-band-gap semiconductor is, for example, a silicon carbide or gallium nitride material or diamond. A power semiconductor chip made of such a wide-band-gap semiconductor can be miniaturized because the semiconductor chip has a high withstand voltage and a high allowable current density. Use of the miniaturized chip can miniaturize a semiconductor device in which the chip is provided. The high heat resistance of the chip allows heat-radiating fins of the heat sink to be miniaturized, and a water-cooling unit can be changed into an air-cooling unit. Therefore, the semiconductor device can be more miniaturized. Since the device has a low power loss and high efficiency to make it possible to obtain a high-efficiency semiconductor device.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-178595, filed on Sep. 13, 2016 including specification, claims, drawings and summary, on which the Convention priority of the present application is based, is incorporated herein by reference in its entirety.

The invention claimed is:

1. A semiconductor device comprising:
an insulating board;
a circuit pattern disposed on the insulating board;
a semiconductor chip connected to the circuit pattern;
a case disposed on and entirely to one side of the insulating board to surround the circuit pattern and the semiconductor chip; and
a cured resin disposed in the case to seal the circuit pattern and the semiconductor chip, wherein
the case includes a surface portion directly opposing and adjacent to a surface portion of the insulating board, and
no bonding material other than the resin is disposed between the opposing and adjacent surface portions.

2. The semiconductor device according to claim 1, further comprising an uncured source material annularly disposed in a gap between an upper surface of the insulating board and a lower surface of the case, directly contacting with the upper surface of the insulating board and the lower surface of the case and having a viscosity higher than that of the uncured resin.

3. The semiconductor device according to claim 1, further comprising an elastic member disposed in a concave part annularly formed in a lower surface of the case and directly contacts with an upper surface of the insulating board and the lower surface of the case.

4. The semiconductor device according to claim 3, wherein a natural length of the elastic member which is not compressed in the concave part is greater than a depth of the concave part.

5. A semiconductor device comprising:
an insulating board;
a circuit pattern disposed on the insulating board;
a semiconductor chip connected to the circuit pattern;
a case disposed on the insulating board to surround the circuit pattern and the semiconductor chip; and
a cured resin disposed in the case to seal the circuit pattern and the semiconductor chip,
wherein a convex part annularly disposed on an upper surface of the insulating board is fitted in a concave part annularly formed in a lower surface of the case.

6. The semiconductor device according to claim 5, wherein the convex part is made of a same material as that of the circuit pattern and has a height equal to that of the circuit pattern.

7. The semiconductor device according to claim 5, wherein a depth of the concave part is equal to or greater than a height of the convex part.

8. The semiconductor device according to claim 5, further comprising an elastic member disposed on the convex part in the concave part.

9. The semiconductor device according to claim 1, wherein a convex part annularly formed on a lower surface of the case cuts into the insulating board having elasticity.

10. The semiconductor device according to claim 1, further comprising an elastic member annularly formed in a gap between an upper surface of the insulating board and a lower surface of the case.

11. The semiconductor device according to claim 10, wherein a convex part formed on the lower surface of the case cuts into the elastic member.

12. The semiconductor device according to claim 1, wherein the semiconductor chip is made of a wide-band-gap semiconductor.

13. The semiconductor device according to claim 1, wherein a convex part annularly disposed on an upper surface of the insulating board is fitted in a concave part annularly formed in a lower surface of the case.

14. A semiconductor device comprising:
an insulating board including an upper surface;
a circuit pattern disposed on the upper surface of the insulating board;
a semiconductor chip connected to the circuit pattern;
a case including a lowermost surface disposed on the insulating board to surround the circuit pattern and the semiconductor chip, and an area of the lowermost surface faces an area of the upper surface with no bonding material therebetween; and
a cured resin disposed in the case to seal the circuit pattern and the semiconductor chip, wherein
the facing areas directly contact one another.

* * * * *